United States Patent
Song et al.

(10) Patent No.: US 6,795,457 B2
(45) Date of Patent: Sep. 21, 2004

(54) MULTIPLE WAVELENGTH SURFACE-EMITTING LASER DEVICE AND METHOD FOR ITS MANUFACTURE

(75) Inventors: Young-jin Song, Yongin-si (KR); Seung-ho Nam, Seongnam-si (KR); Byoung-lyong Choi, Seoul (KR); Jae-ho You, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 224 days.

(21) Appl. No.: 09/867,709

(22) Filed: May 31, 2001

(65) Prior Publication Data

US 2002/0044585 A1 Apr. 18, 2002

(30) Foreign Application Priority Data

Aug. 23, 2000 (KR) ........................................ 2000-48986

(51) Int. Cl.[7] .............................. H01S 3/10; H01S 5/00; H01S 3/14
(52) U.S. Cl. ............................. 372/23; 372/43; 372/50; 372/68
(58) Field of Search ............................. 372/23, 43, 50, 372/68, 46, 96, 45, 20, 97

(56) References Cited

U.S. PATENT DOCUMENTS 5,319,655 A * 6/1994 Thornton ..................... 372/23
5,699,375 A * 12/1997 Paoli ........................... 372/50
6,320,206 B1 * 11/2001 Coman et al. ................. 257/94

* cited by examiner

Primary Examiner—Don Wong
Assistant Examiner—Armando Rodriguez
(74) Attorney, Agent, or Firm—Sughrue Mion, PLLC

(57) ABSTRACT

A multiple wavelength surface-emitting laser device equipped with a substrate and a plurality of surface-emitting lasers formed on the substrate by a continuous manufacturing process is provided. Each surface-emitting laser includes a bottom reflection layer on the substrate, that is doped with impurities of one type and composed of alternating semiconductor material layers having different refractive indexes; an active layer that is formed on the bottom reflection layer; an intermediate layer that is doped with impurities of the other type on the active layer; a top electrode that is formed on the intermediate layer to have a window through which light is emitted; and a dielectric reflection layer where dielectric materials with different refractive indexes are alternately layered on the intermediate layer and/or the top electrode to a thickness suitable for a desired resonance wavelength, and the resonance wavelength is controlled by adjusting the thickness of the dielectric reflection layer.

13 Claims, 5 Drawing Sheets

MULTIPLE WAVELENGTH SURFACE-EMITTING LASER DEVICE AND METHOD FOR ITS MANUFACTURE

BACKGROUND OF THE INVENTION

1. Field of the Invention

The present invention relates to a multiple wavelength surface-emitting laser device and a method for its manufacture and, more particularly, to the multiple wavelength surface-emitting laser device that is equipped with a plurality of vertical cavity surface-emitting lasers, each of which emits light with a different wavelength, formed by a continuous process on a semiconductor substrate and a method for its manufacture.

This application claims priority form Korean Patent Application No. 2000-48986 which is incorporated herein by reference.

2. Description of the Related Art

In general, a surface-emitting laser emits light in a direction perpendicular to is its semiconductor material layers, unlike an edge emitting laser. This surface-emitting laser has a small radiating angle and emits a beam with a substantially circular cross-section unlike the edge emitting laser, and is easy to arrange in two dimensions, since the surface-emitting laser can be formed by integrating with a plurality of lasers in a desired array on a semiconductor wafer. Therefore, the surface-emitting laser has many advantages over the edge emitting laser in its application.

Commonly, in the field where a plurality of lasers with different wavelengths are needed, such as a LAN system using light and short and long distance communications using WDM (wavelength-division multiplexing), surface-emitting lasers corresponding to the desired wavelengths were manufactured separately and these were put together on a substrate for use. However, the method of putting together on a substrate a plurality of separately manufactured surface-emitting lasers results in a larger optical alignment error due to combining error between the surface-emitting lasers. Also the manufacturing process is complex and the manufacturing cost is thus high, and the above advantages of the surface-emitting laser have not been sufficiently utilized.

In order to fully utilize the advantages of the surface-emitting laser device, it has been suggested that a multiple wavelength surface-emitting laser structure be manufactured by adding a layer for controlling the resonant wavelength to a general surface-emitting laser structure and by a continuous manufacturing process.

Referring to FIG. 1, a conventional multiple wavelength surface-emitting laser has a semiconductor layer structure comprising a bottom-DBR (distributed bragg reflector) layer 1, an AlAs supplying layer 3, an AlGaAs tuning layer 5, an active layer 7, a high resistance part 9 that confines electric current, and a top-DBR layer 11. Here, the curved part of the AlGaAs tuning layer 5 shows the oxidated region, and the region of AlGaAs tuning layer 5 exposed to an atmosphere containing water vapor and oxidated from outside does not have a uniform thickness due to a thickness of the AlGaAs tuning laser 5. If the AlGaAs tuning layer 5 is thin, then the thickness of the oxidated region becomes relatively uniform.

In the conventional multiple wavelength surface-emitting laser device having the semiconductor layer structure as described above, the resonance length is changed by controlling the oxidation ratio of the AlGaAs tuning layer in a later process, in order to obtain the desired resonance wavelength. The change of the refractive index of the AlGaAs tuning layer from 3.4 to 1.6 corresponds to the reduction of its thickness by 12%.

Therefore, since it is possible to change the resonance wavelength by changing the oxidation ratio of the AlGaAs tuning layer through a later process as described above, a multiple wavelength surface-emitting laser device that emits light of a desired wavelength from each of a plurality of surface-emitting lasers that are manufactured in an array in a continuous manufacturing process, can be manufactured.

However, in the conventional multiple wavelength surface-emitting laser device as described above, the oxidation ratio changes rapidly depending on the Al content of the AlGaAs tuning layer 5, and thus precise process control is difficult and reproducibility is low. In addition, mechanical stress is generated between the AlGaAS tuning layer and AlAs supplying layer 3 during oxidation, thus the reliability of the laser device is low.

Furthermore, since the oxidated AlGaAs tuning layer 5 does not conduct electricity, the conventional multiple wavelength surface-emitting laser device with the structure described above should have a structure for electrical contact on top (the A region) of the AlGaAs tuning layer, as shown in FIG. 1, and therefore the structure is complex and requires many processes.

SUMMARY OF THE INVENTION

The present invention is contrived in consideration of the disadvantages described above, and it is thus an objective of the present invention to provide a multiple wavelength surface-emitting laser device of which the resonance wavelength can be controlled by an optical coating method using an optical deposition system, and the manufacturing process is simple and the reliability of the laser device is high compared to the prior art, and a method for its manufacture.

To achieve the above objective, a multiple wavelength surface-emitting laser device is equipped with a substrate and a plurality of surface-emitting lasers that are formed on the substrate by a continuous manufacturing process. Each surface-emitting laser comprises a bottom reflection layer on the substrate, that is doped with impurities of one type and that is composed of alternating semiconductor material layers having different refractive indexes; an active layer that is formed on the bottom reflection layer; an intermediate layer that is doped with impurities of the other type on the active layer; a top electrode that is formed on the intermediate layer to have a window through which light is emitted; and a dielectric reflection layer where dielectric materials with different refractive indexes are alternately layered on the intermediate layer and/or the top electrode to a thickness suitable for a desired resonance wavelength, which is controlled by adjusting the thickness of the dielectric reflection layer.

Here, the dielectric reflection layer is preferably composed of any two dielectric materials with different refractive indexes.

More preferably, the dielectric reflection layer is composed of two dielectric materials selected from the group consisting of $TiO_2$, $Ta_2O_5$, $ZrO_2$, $HfO$, $SiO_2$ and $MgF_2$.

The method for manufacturing the multiple wavelength surface-emitting laser device according to the present invention in order to achieve the above objective comprises a step of forming on a prepared substrate the bottom reflection layer that is doped with impurities of one type and that is alternately layered with semiconductor material layers having different refractive indexes, the active layer, and the intermediate layer that is doped with conductive impurities of a different type; a step of forming an arrangement of a plurality of surface-emitting lasers by removing the intermediate layer, the active layer and a part of the bottom reflection layer by etching; a step of forming on the intermediate layer of each surface-emitting laser a top electrode having a window through which light is emitted; and a step of forming on the intermediate layer and/or the top electrode of each surface-emitting laser a dielectric reflection layer where different dielectric materials are alternately layered to a thickness suitable for a desired resonance wavelength.

Here, the dielectric reflection layer is preferably formed by using an optical deposition unit.

BRIEF DESCRIPTION OF THE DRAWINGS

The above objectives of the present invention will become more apparent by describing in detail a preferred embodiment thereof with reference to the attached drawings, in which.

DETAILED DESCRIPTION OF THE PREFERRED EMBODIMENT(S)

Figure 1:
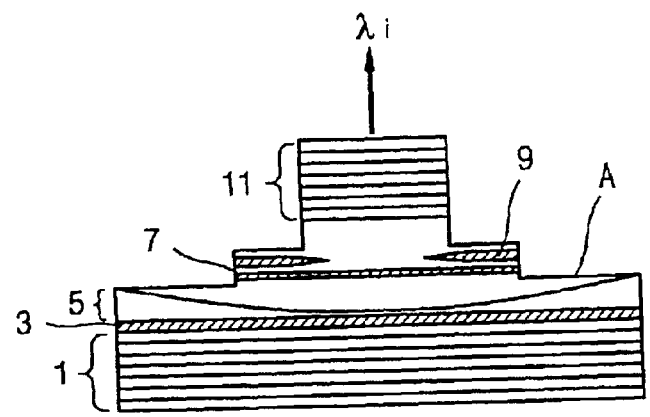
FIG. 1 shows a schematic cross section of an example of a conventional multiple wavelength surface-emitting laser device.
Figure 2:
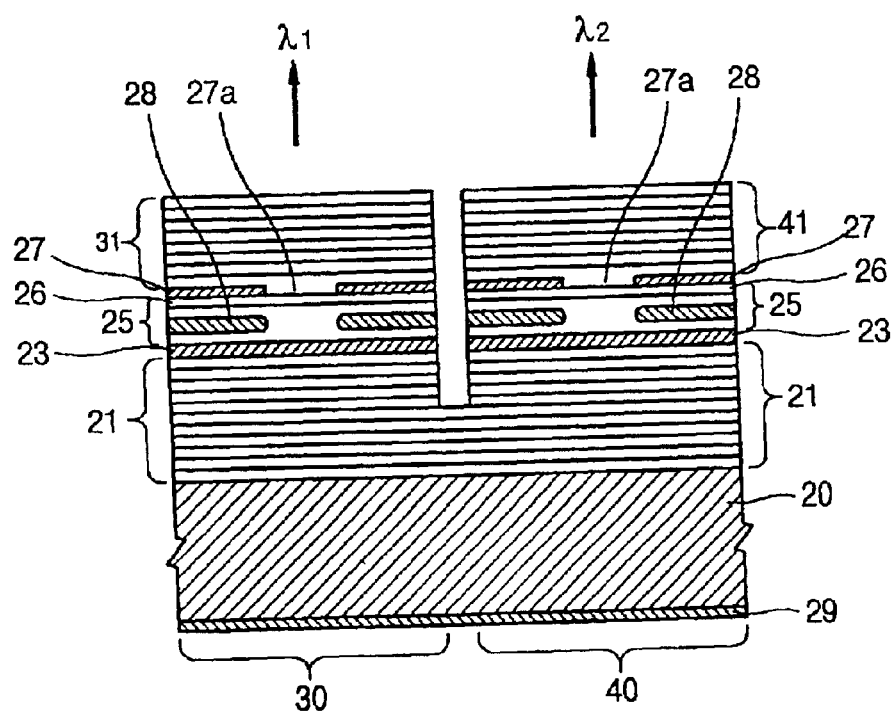
FIG. 2 shows a schematic cross section of a multiple wavelength surface-emitting laser device according to an embodiment of the present invention.

Referring to FIG. 2, a multiple wavelength surface-emitting laser device according to a preferred embodiment of the present invention comprises a substrate 20, first and second surface-emitting lasers 30 and 40 that are formed on the substrate 20 by a continuous manufacturing process and that generate light with different wavelengths $\lambda_1$ and $\lambda_2$, respectively. Also, a bottom electrode 29 that is commonly used by the first and second surface-emitting lasers 30 and 40 is formed on the bottom of the substrate 20.

The substrate 20 is composed of a semiconductor material such as Gallium Arsenide (GaAs) and Indium Phosphorus (InP) containing a certain impurity, for example, an n-type impurity.

The first and second surface-emitting lasers 30 and 40 comprise a bottom reflection layer 21, an active layer 23 and an intermediate layer 25 sequentially formed on the substrate 20, and a top electrode 27 having a window 27a through which light is emitted is formed on the intermediate layer 25. And the first and second surface-emitting lasers 30 and 40 are equipped with first and second dielectric reflection layers 31 and 41 that are formed on the intermediate layer and/or the top electrode 27. Here, the arrangement of the first and second surface-emitting lasers 30 and 40, as described later, is determined by etching a certain region to at least some layers of the bottom reflection layer 21, after sequentially forming the reflection layer 21, the active layer 23 and the intermediate layer 25 on the substrate.

The bottom reflection layer 21 is a DBR (distributed bragg reflector) that consists of several to several tens of pairs of semiconductor compound layers with different refractive indexes. The bottom reflection layer 21 is formed by alternately forming layers of $Al_xGa_{1-x}As$ and $Al_yGa_{1-y}As$ ($x \neq y$, the values of x and y can be varied) doped with, for instance, an n-type impurity.

The active layer 23 has a single or multiple quantum well structure or a super lattice structure. The active layer 23 is a region where an hole and an electron that have moved from the intermediate layer 25 and the bottom reflection layer 21, when current is applied, join together, and the energy transfer due to the joining of the electron and the hole generates light.

The intermediate layer is doped with conductive impurities of the opposite type to those of the bottom reflection layer 21, and forms the top reflection layer together with the dielectric reflection layers 31 and 41. The intermediate layer 25 is formed of alternating $Al_xGa_{1-x}As$ and $Al_yGa_{1-y}As$ ($x \neq y$, the values of x and y can be varied) layers, for instance, doped with a p-type impurity. The top layer of the intermediate layer 25 is preferably equipped with a cap layer 26 that is over doped with the same type of impurity as the intermediate layer to prevents Al contained in the intermediate layer from oxidation when exposed to the atmosphere for a later process and to keep the top electrode 27 off ohmic contact. For example, this cap layer 26 consists of GaAs.

Here, the bottom reflection layer 21, the active layer 23 and the intermediate layer 25 are manufactured by MOCVD (Metal Organic Chemical Vapor Deposition) and/or MBE (Molecular Beam Epitaxial) processes.

Meanwhile, the inside of the intermediate layer 25 of the first and second surface-emitting lasers 30 and 40 preferably further comprises a high resistance part 28 that confines electric current at a region excluding the lower part of each window 27a. This high resistance part 28 is formed by using selective oxidation or proton injection.

The first and second dielectric reflection layers 31 and 41 of the first and second surface-emitting lasers 30 and 40 are preferably manufactured by an optical coating method using a simple general optical deposition system such that the process can be simplified without additional MOCVD and/or MBE processes.

The first and second dielectric reflection layers 31 and 41 are formed by alternately forming layers of dielectric materials having different refractive indexes with thicknesses suitable for desired resonance wavelengths $\lambda_1$ and $\lambda_2$. This first and second dielectric reflection layers 31 and 41 are preferably composed of two dielectric materials having different refractive indexes, selected from the dielectric material group consisting of, for example, $TiO_2$, $Ta_2O_5$, $ZrO_2$, $HfO$, $SiO_2$ and $MgF_2$.

The multiple wavelength surface-emitting laser device according to an embodiment of the present invention having the layer structure as described above can be, for example, formed to the specifications listed in Table 1.

In Table 1, Nos. 1–6 correspond to the bottom reflection layer 21, Nos. 7–13 to the active layer 23, Nos. 14–21 to the intermediate layer 25, and Nos. 22–24 to the dielectric reflection layers 31 and 41. The semiconductor layer of Nos. 1–4 in the bottom reflection layer 21 is layered 40 times, the semiconductor layer of No. 9–10 in the active layer 23 is layered twice, and the dielectric layer of Nos. 22–23 in the dielectric reflection layers 31 and 41 is layered 7 times. No. 21 in the intermediate layer 25 shows the cap layer 26.

TABLE 1

| No. | Thickness of a layer | Material | Content of Al (x) | Number of layers |
|---|---|---|---|---|
| 25 | | air | | |
| 24 | λ/4 | TiO$_2$ | | x1 |
| 23 | λ/4 | SiO$_2$ | | x7 |
| 22 | λ/4 | TiO$_2$ | | x7 |
| 21 | 100A | GaAs | 0 | x1 |
| 20 | 210A | Al(x)GaAs | 0.92–0.2 | x1 |
| 19 | 367A | Al(x)GaAs | 0.92 | x1 |
| 18 | 210A | Al(x)GaAs | 0.2–0.92 | x1 |
| 17 | 307A | Al(x)GaAs | 0.2 | x1 |
| 16 | 210A | Al(x)GaAs | 0.98–0.2 | x1 |
| 15 | 200A | Al(x)GaAs | 0.98 | x1 |
| 14 | 364A | Al(x)GaAs | 0.92 | x1 |
| 13 | 1044A | Al(x)GaAs | 0.3–0.92 | x1 |
| 12 | 130A | Al(x)GaAs | 0.3 | x1 |
| 11 | 70A | GaAs | 0 | x1 |
| 10 | 100A | Al(x)GaAs | 0.3 | x2 |
| 9 | 70A | GaAs | 0 | x2 |
| 8 | 130A | Al(x)GaAs | 0.3 | x1 |
| 7 | 1044A | Al(x)GaAs | 0.92–0.3 | x1 |
| 6 | 467A | Al(x)GaAs | 0.92 | x1 |
| 5 | 210A | Al(x)GaAs | 0.2–0.92 | x1 |
| 4 | 407A | Al(x)GaAs | 0.2 | x40 |
| 3 | 210A | Al(x)GaAs | 0.92–0.2 | x40 |
| 2 | 467h | Al(x)GaAs | 0.92 | x40 |
| 1 | 210A | Al(x)GaAs | 0.2–0.92 | x40 |
| 0 | | N + GaAs substrate | | |

Figure 3:
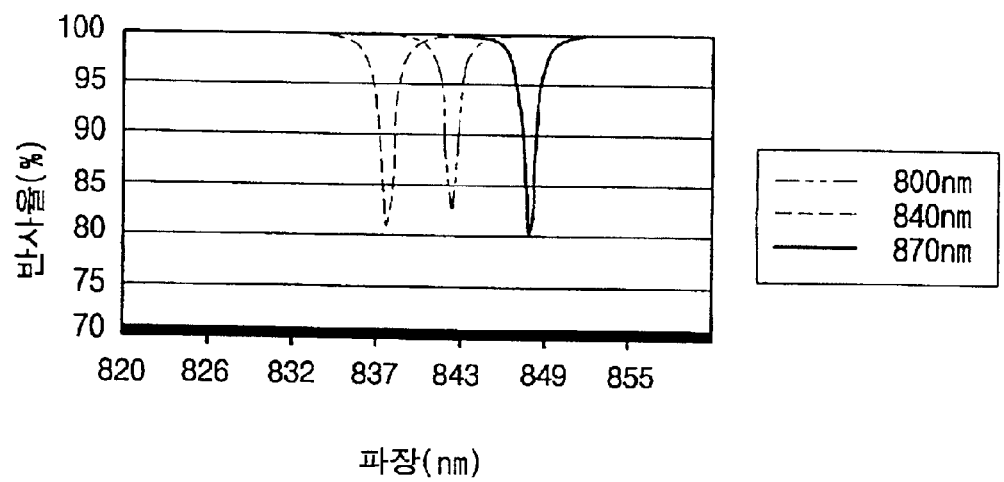
FIG. 3 is a graph illustrating change of resonance wavelength according to change in the thickness of the dielectric layer in FIG. 2.

According to an experiment performed by the present inventor, when the bottom reflection layer 21 has a center wavelength of 845 nm and a maximum reflection ratio of 0.999786, the dielectric reflection layers 31 and 41 have a maximum reflection ratio of 0.997, and the thickness of the dielectric layer of Nos. 22–24 is one fourth of 800 nm, in the surface-emitting lasers 30 and 40 conforming to the specifications in Table 1, a resonance wavelength of 837.07 nm is obtained, as shown in FIG. 3. Also, when the thickness of the dielectric layer of Nos. 22–24 is one fourth of 840 nm, a resonance wavelength of 842.93 nm is obtained, and when the thickness of the dielectric layer of Nos. 22–24 is one fourth of 870 nm, a resonance wavelength of 847.51 nm is obtained.

The principle according to which the resonance wavelength can be varied by adjusting the thickness of the dielectric layer as mentioned above is as follows.

The oscillated wavelength of a laser system is determined by an etalon resonator. In the multiple wavelength surface-emitting laser device, the construction of the intermediate layer 25 and the dielectric reflection layer 31 or 41, and the bottom reflection layer 21 compose the etalon resonator, and the active layer 23 corresponds to the space inside of the etalon resonator.

Therefore, when the transmittance ratio, the reflection ratio and the phase of the light reflected at the bottom reflection layer 21 are $T_b$, $R^+_b$, and $\phi_b$, respectively, and the transmittance ratio, the reflection ratio and the phase of the reflected light of the intermediate layer 25 and the dielectric reflection layer 31 or 41 are $T_a$, $R^-_a$, and $\phi_a$, respectively and the phase change of light in the active layer 23 is $\sigma$, the resonance mode of the etalon resonator is when the transmittance T is a maximum in Formula 1. Here, the $\sigma$ satisfies Formula 2.

$$T = \frac{T_a T_b}{[1-(R_a^- R_b^+)^{0.5}]^2}\left[1 + \frac{4 T_a T_b}{[1-(R_a^- R_b^+)^{0.5}]^2}\sin^2\left(\frac{\phi_a + \phi_b}{2} - \sigma\right)\right]^{-1} \quad (1)$$

$$\sigma = \frac{[2\pi n d]}{\lambda} \quad (2)$$

Here, n is the refractive index of the active layer, d the physical thickness of the active layer, and λ the wavelength.

Therefore, the resonance mode of the etalon resonator is determined by $\phi_a$, $\phi_b$, and $\sigma$, if the reflection ratios of the bottom reflection layer 21, the intermediate layer 25 and the dielectric reflection layer 31 or 41 are determined by the materials used and the number of layers.

By the way, as can be seen in Table 1, $\phi_b$, $\sigma$, and a part of $\phi_a$ excluding the part that is determined by the dielectric reflection layer 31 and 41 are already defined with respect to the bottom reflection layer 21, the active layer 23 and the intermediate layer 25 that are applied commonly to all surface-emitting lasers constituting multiple wavelength surface-emitting laser devices that are manufactured by MOCVD and/or MBE processes. Thus if the phase $\phi_a$ of the light reflected by the dielectric reflection layer 31 or 41 which occupies the larger part of the role of the top reflection layer changes, then the resonance condition changes. Here, since the phase $\phi_a$ of the light reflected by the dielectric reflection layer 31 or 41 changes depending on the thickness of a plurality of dielectric layers, the change in the total thickness of the composite dielectric layer makes the resonance wavelength change.

Therefore, according to the present invention as described above, a multiple wavelength surface-emitting laser device that emits light with desired wavelengths from a plurality of surface-emitting lasers 30 and 40 can be manufactured through a continuous manufacturing processes, by forming the dielectric reflection layers 31 and 41 using a lithography method and an optical deposition system as a later process, without repeating additional MOCVD and/or MBE processes.

An embodiment of a method for manufacturing the multiple wavelength surface-emitting laser device as described above is explained below, with reference to FIGS. 4 through 9.

Figure 4:
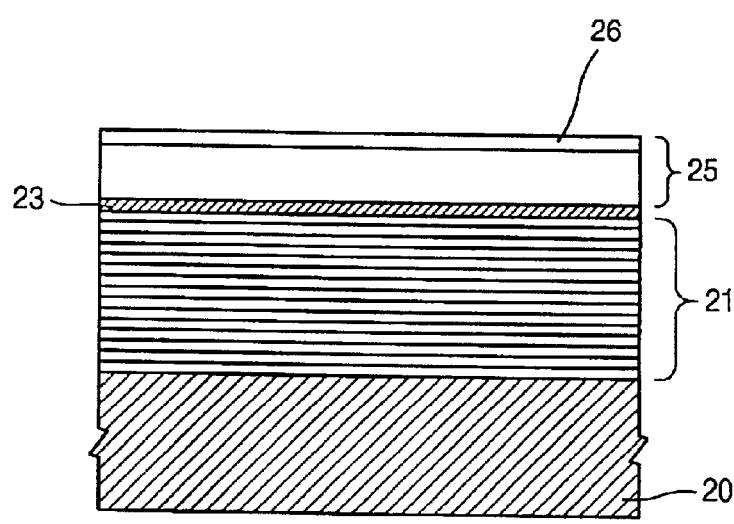
FIGS. 4 through 9 are schematic cross sectional diagrams of each step of manufacturing a surface-emitting laser device to explain a method for manufacturing a multiple wavelength surface-emitting laser according to an embodiment of the present invention.

As shown in FIG. 4, the substrate 20 is prepared, and the bottom reflection layer 21 that is doped with impurities of one type and composed of alternating layers of semiconductor materials having different refractive indexes, the active layer 23, and the intermediate layer 25 that is doped with impurities of a type different from that of the bottom reflection layer are formed on the substrate 20.

Here, the bottom reflection layer 21, the active layer 23 and the intermediate layer, etc. are manufactured by epitaxial growth using semiconductor growth equipment such as MOCVD and MBE equipment.

Figure 5:
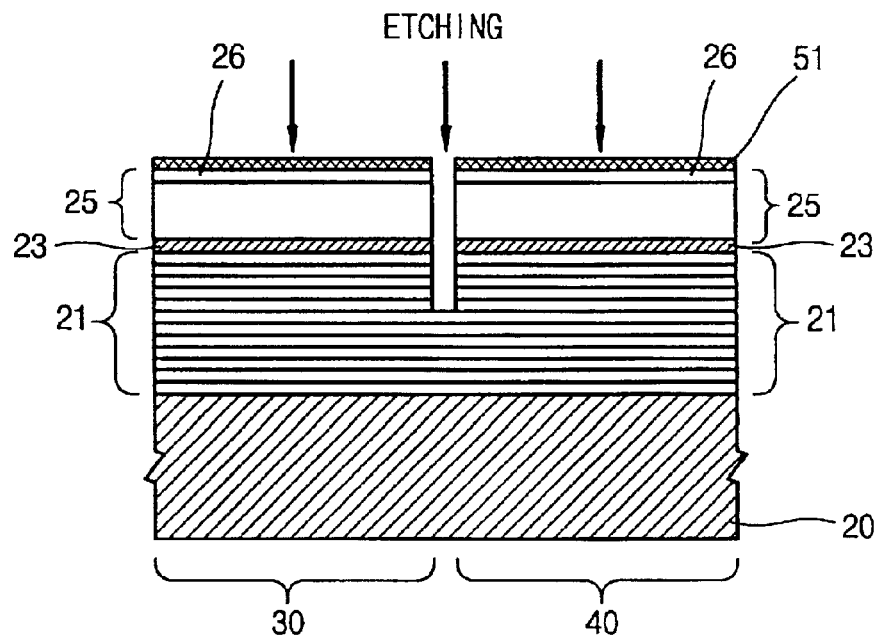

Subsequently, as shown in FIG. 5, after positioning an etching mask 51 having a pattern for forming an arrangement of a desired number of surface-emitting lasers 30 and 40 on the intermediate layer, the intermediate layer 25, the active layer 23 and at least a part of the bottom reflection layer 21 are removed by dry etching. According to this, an arrangement of a plurality of surface-emitting lasers 30 and 40 that can be drove electrically independently are formed in a desired pattern.

Figure 6:
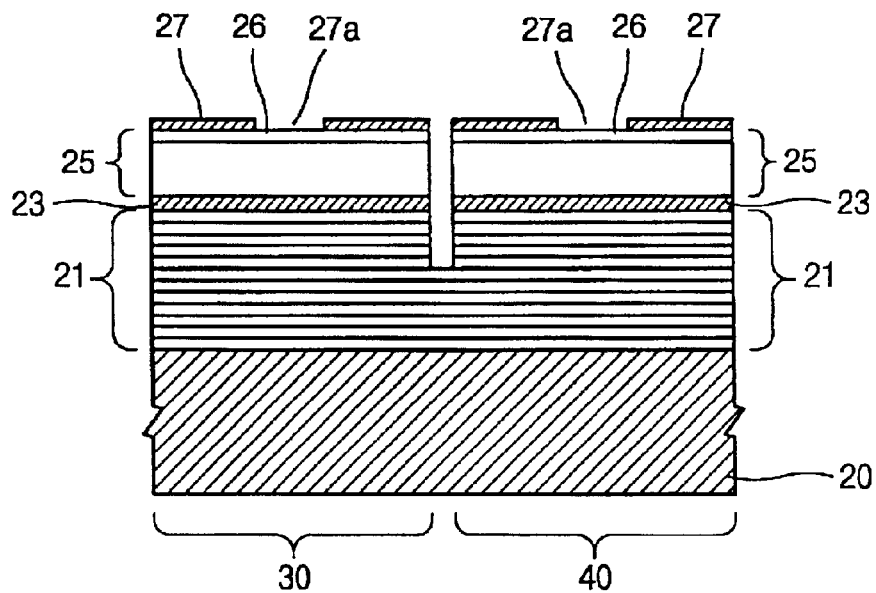

Next, as shown in FIG. 6, after removing the mask 51, the top electrode 27 having the window 27a through which light is emitted, are formed on the intermediate layer 25. Here, a dry etching process where the arrangement of a plurality of surface-emitting lasers 30 and 40 is defined after first forming the top electrode 27, can be performed.

The bottom reflection layer 21, the active layer 23, the intermediate layer 25 and the top electrode 27 are common to all the surface-emitting lasers 30 and 40 and are formed on the same substrate 20 and constitute the multiple wavelength surface-emitting laser device according to the present invention.

Figure 7:
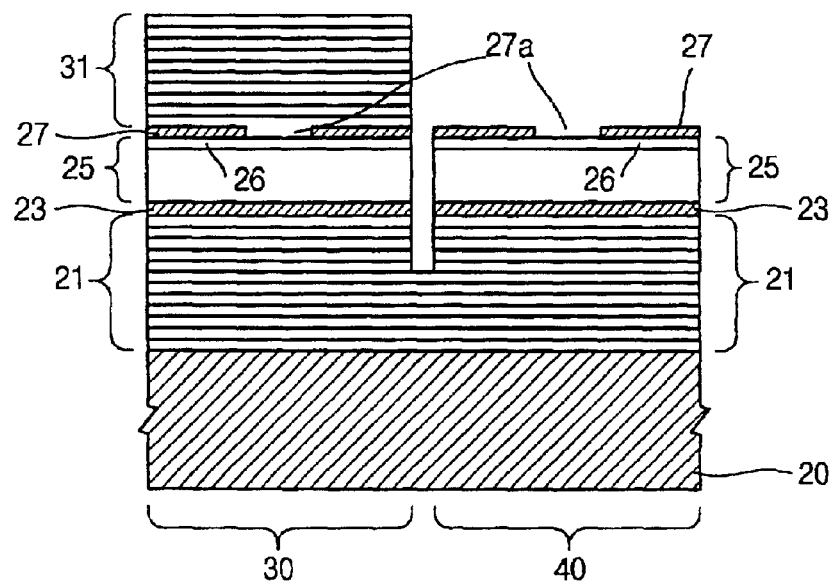

After this, as shown in FIG. 7, the dielectric reflection layer 31 is deposited on the intermediate layer and/or the top electrode 27 of the surface-emitting laser 30 which should generate light with wavelength $\lambda_1$ such that the resonance wavelength is $\lambda_1$.

Figure 8:
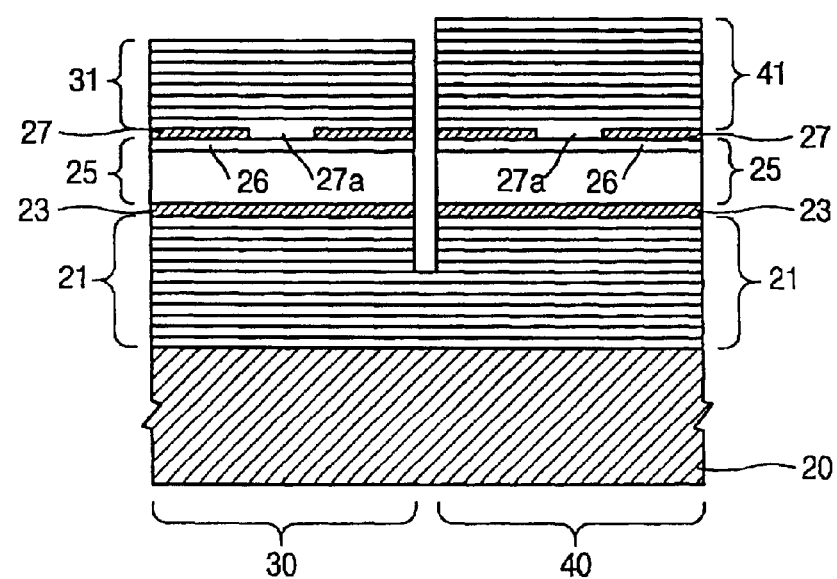

Following this, as shown in FIG. 8, the dielectric reflection layer 41 is deposited on the top electrode 27 of the surface-emitting laser 40 which should generate light with wavelength $\lambda_2$ different from $\lambda_1$ such that the resonance wavelength is $\lambda_2$.

The step of depositing the dielectric reflection layers 31 and 41 as described above is repeated as many times as the number of lasers having different wavelengths that are required in the multiple wavelength surface-emitting laser device according to the present invention.

Here, the dielectric reflection layers 31 and 41 are manufactured by using an optical deposition system, and a lithography method is utilized during the process of repeatedly depositing the dielectric reflection layers 31 and 41.

Figure 9:
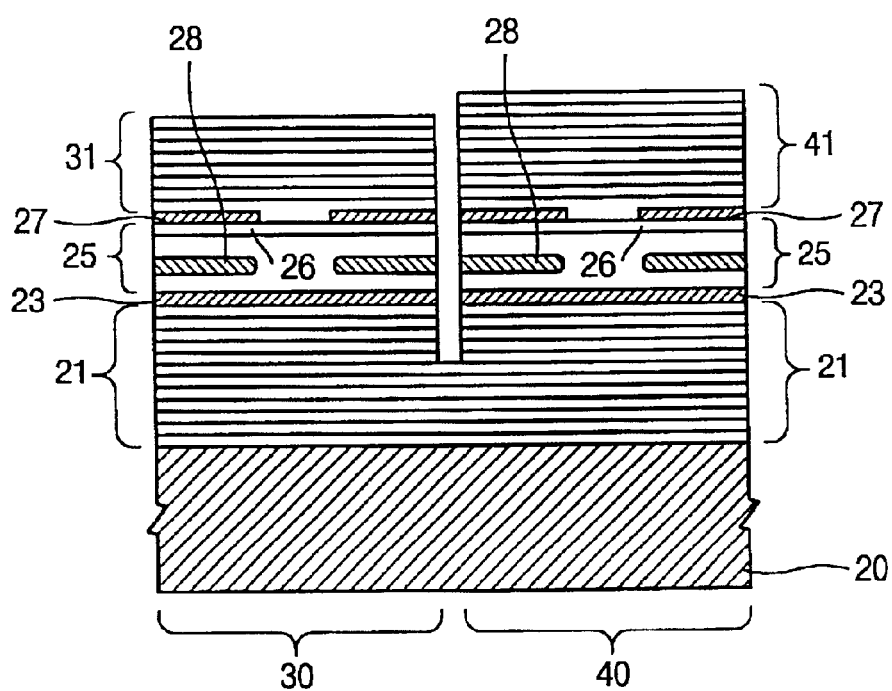

After completing the deposition of the dielectric reflection layers 31 and 41 suitable for desired resonance wavelengths as described above, the bottom electrode is finally formed on the bottom of the substrate 20, as shown in FIG. 9, thus completing the manufacture of the multiple wavelength surface-emitting laser device.

An embodiment of the method for manufacturing a multiple wavelength surface-emitting laser device according to the present invention preferably further comprises the step of forming the high resistance part 28 by proton injection or selective oxidation at a part of the intermediate layer 25 before forming the bottom electrode 29. This step of forming the high resistance part can be performed before forming the top electrode.

The multiple wavelength surface-emitting laser device according to the present invention as described above can be manufactured by a simple manufacturing process, and thus can contribute to lowering costs when applied to fields where a plurality of lasers having different wavelengths, such as a LAN system using light and short and long distance communications using a WDM method, are required.

In the above, the case where the multiple wavelength surface-emitting laser device is composed of two surface-emitting lasers 30 and 40 was taken as an example, for simplicity of explanation. Thus the arrangement of a plurality of surface-emitting lasers 30 and 40 and the wavelength of each laser can be varied according to the design conditions.

According to the present invention as described above, the resonance wavelength is controlled by adjusting the thickness of the dielectric layer, and thus a multiple wavelength surface-emitting laser device that emits light of a desired wavelength from each of a plurality of surface-emitting lasers can be manufactured in a continuous process, which is simple and has high reliability.

It is contemplated that numerous modifications mabe made to the multiple wavelength surface-emitting laser device, and method for its manufacture of, of the present invention without departing from the spirit and scope of the invention as defined in the following claims.

What is claimed is:

1. A multiple wavelength surface-emitting laser device comprising:

a substrate; and a plurality of surface-emitting lasers that are formed on the substrate by a continuous manufacturing process, wherein each of said plurality of surface-emitting lasers comprises:

a bottom reflection layer on the substrate, that is doped with impurities of a first type and that is composed of alternating semiconductor material layers having different refractive indexes;

an active layer on the bottom reflection layer;

an intermediate layer that is doped with impurities of a second type on the active layer;

a top electrode on the intermediate layer, said top electrode having a window through which light is emitted; and a dielectric reflection layer where dielectric materials with different refractive indexes are alternately layered on the intermediate layer and the top electrode to be dielectric layers of a thickness suitable for a resonance wavelength, and the resonance wavelength is controlled by adjusting the thickness of the dielectric layers of the dielectric reflection layer.

2. The multiple wavelength surface-emitting laser of claim 1, wherein the dielectric reflection layer is composed of two different dielectric materials with different refractive indexes.

3. The multiple wavelength surface-emitting laser of claim 2, wherein the dielectric reflection layer is composed of any two dielectric materials selected from the group consisting of $TiO_2$, $Ta_2O_5$, $ZrO_2$, $HfO$, $SiO_2$ and $MgF_2$.

4. The multiple wavelength surface-emitting laser of claim 1, wherein the dielectric reflection layer is composed of any two dielectric materials selected from the group consisting of $TiO_2$, $Ta_2O_5$, $ZrO_2$, $HfO$, $SiO_2$ and $MgF_2$.

5. The multiple wavelength surface-emitting laser device of claim 1 further comprising a high resistance part that confines electric current between the active layer and the top electrode.

6. A method of manufacturing a multiple wavelength surface-emitting laser device comprising the steps of sequentially forming, on a prepared substrate, a bottom reflection layer, that is doped with impurities of a first type and composed of alternating semiconductor material layers having different refractive indexes, an active layer and an intermediate layer that is doped with impurities of a second type;

forming an arrangement of a plurality of surface-emitting lasers by removing, from a region separating the surface emitting lasers, the intermediate layer, the active layer and a part of the bottom reflection layer by etching;

forming on the intermediate layer of each surface-emitting laser a top electrode having a window through which light is emitted; and forming on at least one of the intermediate layer and the top electrode of each surface-emitting laser, a dielectric reflection layer where different dielectric materials are alternately layered to be dielectric layers of a thickness suitable for a resonance wavelength, and the resonance wavelength is controlled by adjusting the thickness of the dielectric layers of the dielectric reflection layer.

7. The method for manufacturing a multiple wavelength surface-emitting laser device of claim 6, wherein the dielectric reflection layer is composed of two different dielectric materials with different refractive indexes.

8. The method for manufacturing a multiple wavelength surface-emitting laser device of claim 7, wherein the dielectric reflection layer is composed of any two dielectric materials selected from the group consisting of $TiO_2$, $Ta_2O_5$, $ZrO_2$, $HfO$, $SiO_2$ and $MgF_2$.

9. The method for manufacturing the multiple wavelength surface-emitting laser device of claim 7, wherein the dielectric reflection layer is formed by using an optical deposition unit.

10. The method for manufacturing the multiple wavelength surface-emitting laser of claim 6, wherein the dielectric reflection layer is composed of any two dielectric materials selected from the group consisting of $TiO_2$, $Ta_2O_5$, $ZrO_2$, $HfO$, $SiO_2$ and $MgF_2$.

11. The method for manufacturing the multiple wavelength surface-emitting laser device of claim 6, wherein the dielectric reflection layer is formed by using an optical deposition system.

12. The method for manufacturing the multiple wavelength surface-emitting laser of claim 6 further comprising a step of forming a high resistance part that confines electric current between the active layer and the top electrode.

13. A multiple wavelength surface-emitting laser device comprising:

a substrate; and a plurality of surface-emitting lasers formed on the substrate by a continuous manufacturing process, wherein each of said plurality of surface-emitting lasers comprises:

a bottom reflection layer on the substrate, that is doped with impurities of a first type and that is composed of alternating semiconductor material layers having different refractive indexes;

an active layer on the bottom reflection layer;

an intermediate layer that is doped with impurities of a second type on the active layer;

a top electrode on the intermediate layer, said top electrode having a window through which light is emitted; and a dielectric reflection layer comprising dielectric layers composed of dielectric materials with different refractive indexes alternately layered on the intermediate layer and the top electrode so that a thickness of the dielectric layers is optimized for a resonance wavelength, and the resonance wavelength is controlled by adjusting the thickness of the dielectric layers of the dielectric reflection layer.

* * * * *